(12) United States Patent
Huang et al.

(10) Patent No.: US 8,937,242 B2
(45) Date of Patent: Jan. 20, 2015

(54) SOLAR ENERGY SYSTEM (75) Inventors: Chen-Yang Huang, Hsinchu County (TW); Sheng-Chieh Tai, Taichung County (TW); Ming-Hsien Wu, Tainan County (TW); Wen-Yih Liao, Taichung (TW); Chia-Ling Li, Taipei County (TW)

(73) Assignee: Industrial Technology Research Institute, Hsinchu (TW)

( * ) Notice: Subject to any disclaimer, the term of this patent is extended or adjusted under 35 U.S.C. 154(b) by 1178 days.

(21) Appl. No.: 12/625,372

(22) Filed: Nov. 24, 2009

(65) Prior Publication Data
US 2011/0120527 A1    May 26, 2011

(51) Int. Cl.
*H01L 31/052* (2014.01)
*H01L 31/055* (2014.01)
*G02B 6/43* (2006.01)
*F21V 8/00* (2006.01)

(52) U.S. Cl.
CPC ............ *H01L 31/055* (2013.01); *G02B 6/0023* (2013.01); *G02B 6/0038* (2013.01); *H01L 31/0522* (2013.01); *G02B 6/0055* (2013.01); *Y02E 10/52* (2013.01)
USPC ............ 136/247; 136/246; 136/257; 136/259

(58) Field of Classification Search
USPC .................................................. 136/246, 247
See application file for complete search history.

(56) References Cited

U.S. PATENT DOCUMENTS

| | | | |
|---|---|---|---|
| 4,108,540 A * | 8/1978 | Anderson et al. ............. | 136/246 |
| 4,127,425 A | 11/1978 | Chambers | |
| 4,140,544 A | 2/1979 | Sill | |
| 4,164,432 A * | 8/1979 | Boling .......................... | 136/247 |
| 4,324,946 A * | 4/1982 | Gravisse ....................... | 136/247 |
| 4,329,535 A | 5/1982 | Rapp | |
| 4,357,486 A * | 11/1982 | Blieden et al. ................ | 136/247 |
| 6,294,723 B2 * | 9/2001 | Uematsu et al. .............. | 136/246 |
| 6,476,312 B1 * | 11/2002 | Barnham ....................... | 136/246 |
| 2008/0000526 A1 * | 1/2008 | Madigan ....................... | 136/257 |
| 2008/0271776 A1 | 11/2008 | Morgan | |
| 2009/0056791 A1 * | 3/2009 | Pfenninger et al. ........... | 136/247 |

* cited by examiner

*Primary Examiner* — Jonathan Johnson
*Assistant Examiner* — Andrew Golden (57) ABSTRACT

The invention provides a solar energy system. A flexible transparent body includes a top surface, a bottom surface and two edges, wherein the top surface is a light receiving surface for receiving light with a first wave-length. A plurality of solar cells is disposed on at least one of the edges of the flexible transparent body, wherein the solar cells can covert light having a second wave-length into electrical energy. A wave-length converting layer is provided for converting light with the first wave-length to light with the second wave-length.

18 Claims, 10 Drawing Sheets

SOLAR ENERGY SYSTEM

BACKGROUND OF THE INVENTION

1. Field of the Invention

The invention relates to green energy technologies and more particularly relates to a solar energy system.

2. Description of the Related Art

In conventional the photoelectric conversion efficiency of the silicon-based solar cells have efficiencies ranging below 20%. Compound semiconductor solar cells, based on III-V compounds, have greater than 20% efficiency. However, they are still not widely applied due to the high costs. Thin film solar cells are lower in cost, but are inferior in the photoelectric conversion efficiency and the stability compared to the foregoing solar cells. Meanwhile, the silicon-based solar cells are too heavy for user to be carriered. Therefore, there is a need to develop a portable folded solar energy system.

Besides, flexible solar cells include dye-sensitized solar cells (DSSC), polymer photovolties cells and thin film solar cells. The dye-sensitized solar cells and polymer photovolties cells have low cost, but are unfavorable compared to other flexible solar cells because of the photoelectric conversion efficiency of only 5%. The thin film solar cells have photoelectric conversion efficiency ranging from 10% to 13%. However, the production yield is low and only connecting sections are flexible.

BRIEF SUMMARY OF INVENTION

Accordingly, the invention provides a solar energy system. A flexible transparent body includes a top surface, a bottom surface and two edges, wherein the top surface is a light receiving surface for receiving light with a first wave-length. A plurality of solar cells is disposed on at least one of the edges of the flexible transparent body, wherein the solar cells can covert light having a second wave-length into electrical energy. A wavelength converting layer is provided for converting light with the first wave-length to light with the second wave-length.

BRIEF DESCRIPTION OF DRAWINGS

The invention can be more fully understood by reading the subsequent detailed description and examples with references made to the accompanying drawings, wherein.

DETAILED DESCRIPTION OF INVENTION

Figure 1:
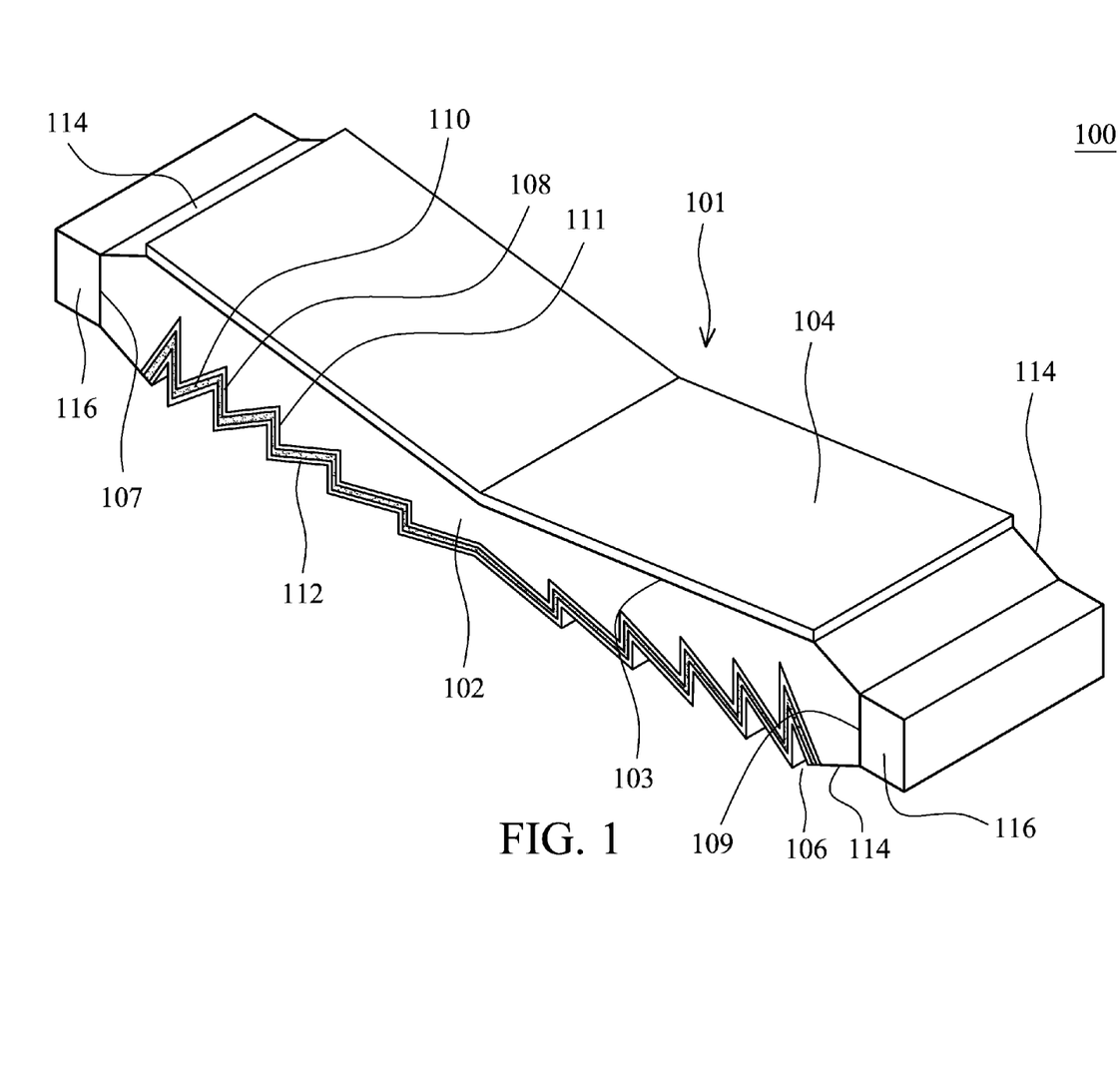
FIG. 1 shows a three dimensional view of a solar energy system of an embodiment of the invention.
Figure 2:
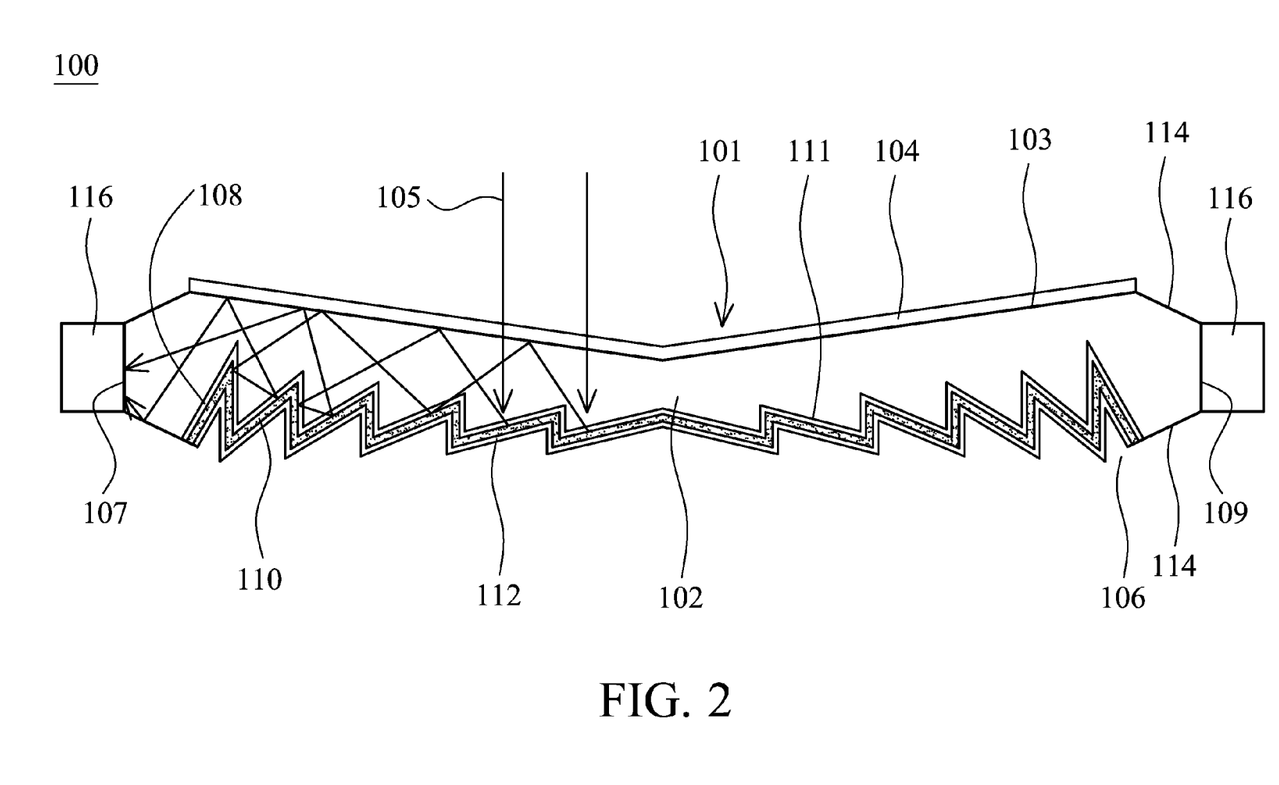
FIG. 2 shows a section view of the solar energy system of an embodiment of the invention.
Figure 3:
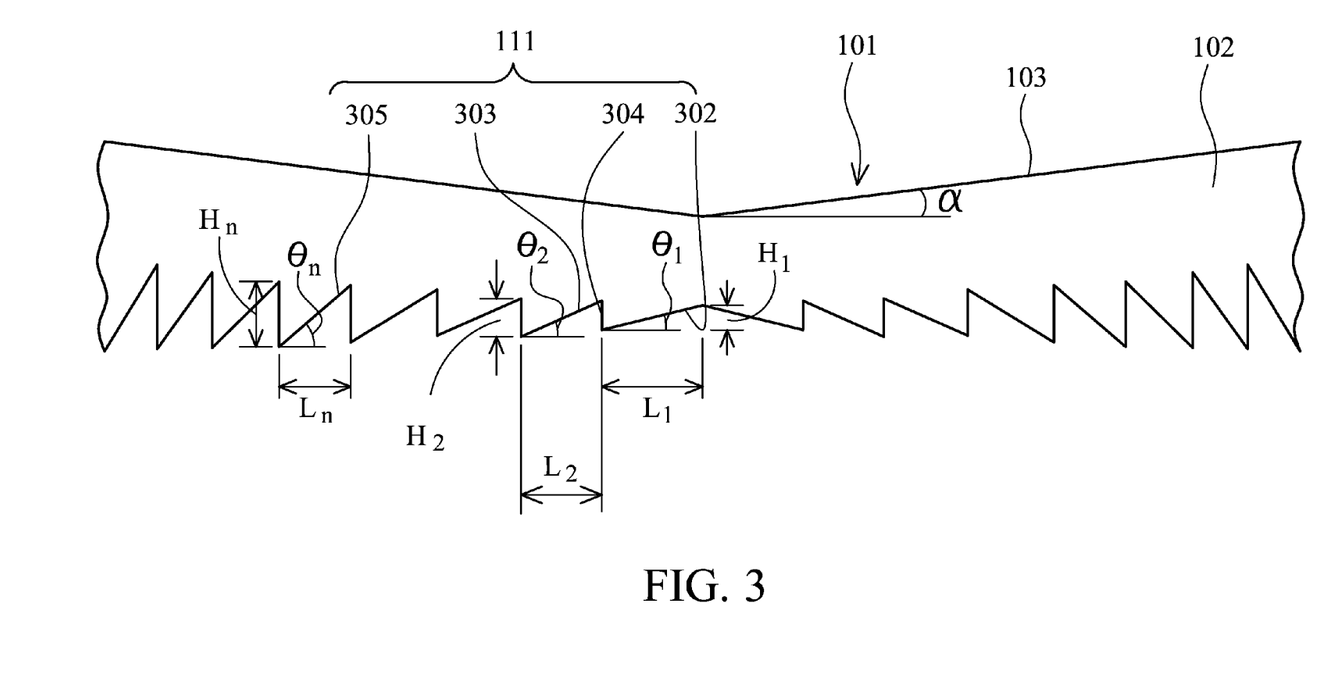
FIG. 3 illustrates the detailed structure of the top surface and the bottom structure of a light-guide member of a solar energy system of an embodiment of the invention.

Referring to FIG. 1, which shows a three dimensional view of a solar energy system of an embodiment of the invention, a flexible solar system 100 is provided to combine solar cells 116 with an ultra-thin light-guide member 101 including a flexible transparent body 102, an edge filter 104 and a wavelength converting layer 108. The detailed description of the flexible solar energy system 100 is illustrated in accordance with FIG. 2 which shows a section view of the solar energy system of an embodiment of the invention. As shown in FIG. 2, the embodiment combines solar cells 116 with a flexible light-guide member 101. The light-guide member 101 primarily comprises a flexible transparent body 102, which includes a top surface 103, a bottom surface 111 and two edge surfaces 107, 109, and can be formed of transparent plastics, such as polymethyl methacrylate (PMMA), polyimide (PI), polyethylene terephthalate (PET), polyethylene naphthalene (PEN) or polydimethylsiloxane (PDMS). The top surface 103 of the light guide member 101 is a wedge-shaped light-receiving surface, and the bottom surface 111 has a sawtooth microstructure in the embodiment. The detailed structure of the top surface 103 and the bottom structure 111 of the light-guide member 101 is illustrated in accordance with FIG. 3. Referring to FIG. 3, the top surface 103 of the light-guide member 101 slopes upwardly at a slope angle α from a center point to the edges of the flexible transparent body 102. In an embodiment of the invention, the slope angle α is 0°~15°. The sawtooth microstructure of the bottom surface 111 of the light-guide member 101 is a mirror symmetrical structure and is constituted by a plurality of slope sides 302 and vertical sides 304 wherein the slope sides 302 is connected sequentially to the vertical sides 304. The first slope side 302 having a slope angles $\theta_1$, a horizontal length $L_1$ and a vertical height $H_1$, the second slope side 303 having a slope angles $\theta_2$, a horizontal length $L_2$ and a vertical height $H_2$, and the $n_{th}$ slope side 305 having a slope angles $\theta_n$, a horizontal length $L_n$ and a vertical height $H_n$ are formed from the center point to the two edges of the light guide member 101. In an embodiment of the invention, the series connected slope sides 302 and vertical sides 304 of the sawtooth microstructure are arranged periodically so that $\theta_1=\theta_2=\ldots=\theta_n$, $L_1=L_2=\ldots=L_n$, and $H_1=H_2=\ldots=H_n$. In another embodiment of the invention, the series connected slope sides 302 and vertical sides 304 of the sawtooth microstructure are gradually changed so that $\theta_1>\theta_2>\ldots>\theta_n$, $L_1<L_2<\ldots<L_n$, and $H_1>H_2>\ldots>H_n$.

In a further embodiment of the invention, the series connected slope sides 302 and vertical sides 304 of the sawtooth microstructure are gradually changed so that $\theta_1<\theta_2<\ldots<\theta_n$, $L_1>L_2>\ldots>L_n$, and $H_1<H_2<\ldots<H_n$.

In an example where the light-guide has an A4 size (20 cm×30 cm), θ is gradually changed from 0.1° to 89°, L is gradually changed from 5 μm to 10 mm, and H is gradually changed from 1 μm to 500 μm. It is noted that the invention can optimize α, $\theta_1, \theta_2, \ldots, \theta_n$ so that light passing through the edge filter can be reflected between the top surface and the bottom surface of the light-guide member 101 to be guided to the solar cells at the edges of the light-guide member 101.

Referring back to FIG. 2, an edge filter 104 is formed on the top surface 103 of the flexible transparent body 102. In the embodiment, the edge filter 104 is a stack of at least two dielectric layers with a high and a low refraction index formed by a physical vapor deposition or chemical vapor deposition process. For example, the edge filter 104 comprises multiple stack of dielectric layers wherein the first dielectric layer can be $TiO_2$ and the second dielectric layer can be $SiO_2$, the first dielectric layer can be $Nb_2O_5$ and the second dielectric layer can be $SiO_2$, or the first dielectric layer can be $Ta_2O_5$ and the second layer dielectric can be $SiO_2$. In an example of the invention, when thickness of $Ta_2O_5$ is A and thickness of $SiO_2$ is B, the edge filter includes 31 layers with a stack of $Ta_2O_5$ and $SiO_2$. Specifically, the edge filter is a stack layer with [½B, A, ½B] which is stacked 15 times, and the thickness of $Ta_2O_5$ (A) can be 102 nm and the thickness of $SiO_2$ (B) can be 143 nm. A wavelength converting layer 108 is formed on the bottom surface of the flexible transparent body 102, a reflecting layer 110 is formed under the wavelength converting layer 108, and a protective layer 112 is formed to cover the reflecting layer 110. In the embodiment, the wavelength converting layer 108 is phosphor or dyes formed on the bottom surface of the flexible transparent body 102 by an evaporation, spin coating or immersion process. For example, the wavelength converting layer 108 is organic dyes, such as rhodamine or perylene or inorganic quantum dot material, such as CdTe or ZnTe. The reflecting layer 110 is metal with high reflectivity, such as silver or aluminum, formed by a physical vapor deposition or chemical vapor deposition process. As shown in FIG. 2, tapers 114 with reflective surfaces are formed on a portion of the top surface and the bottom surface of the flexible transparent body 102 neighboring the solar cells 116, such that light 105 can be guided to the solar cells 116. Solar cells 116 are attached to the edges of the flexible transparent body 102 and the solar cells 116 is silicon based semiconductor solar cells, such as a single crystal, polysilicon or amorphous silicon, compound semiconductor solar cells, such as GaAs, GaP, and GaN or combination thereof, dye-sensitized solar cells (DSSC), polymer photovolties cells or thin film solar cells. The solar cells 116 preferably are compound semiconductor solar cells with high photoelectric conversion efficiency. The solar cells 116 are packaged elements with solar cell bare chips bond on a bonding metal layer on the flexible transparent body 102 by wire bonding, die bonding or eutectic bonding.

Figure 4:
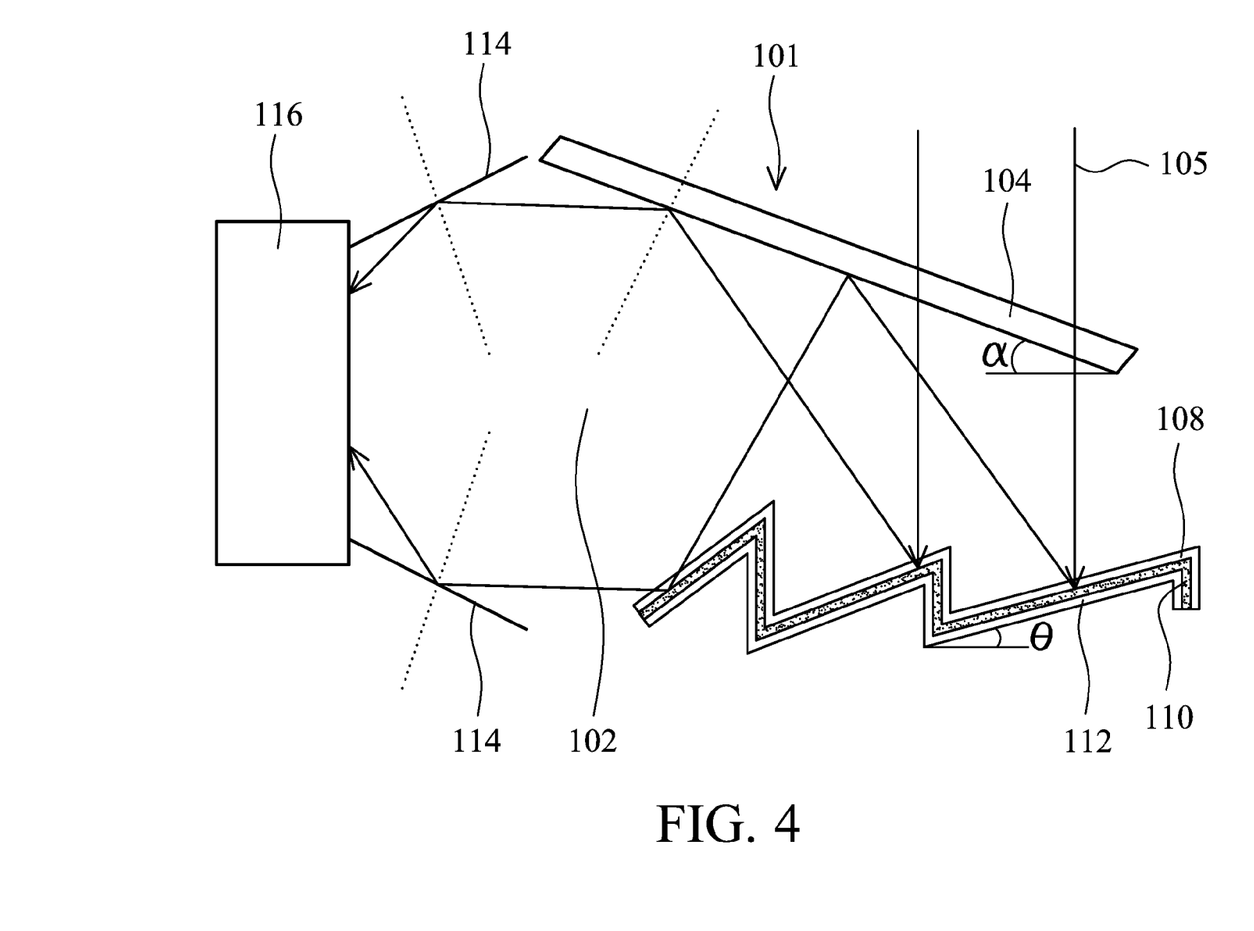
FIG. 4 illustrates operation of the light-guide member of the solar energy system of an embodiment of the invention.
Figure 5A:
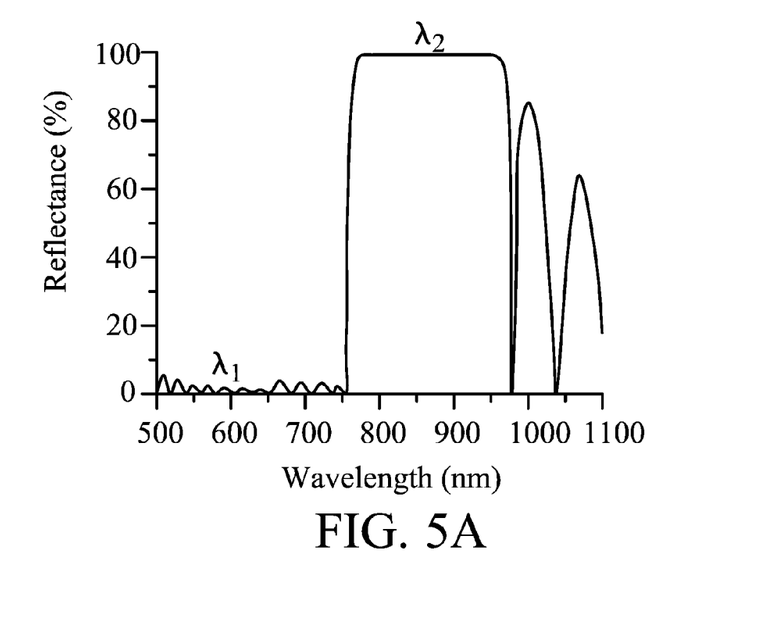
FIG. 5A shows reflectance as a function of wavelength of an edge filter of the solar energy system of an embodiment of the invention.
Figure 5B:
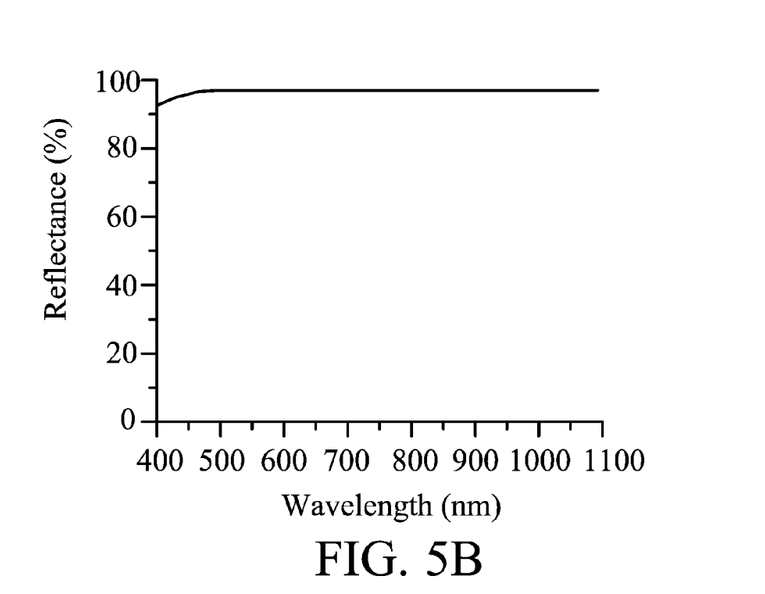
FIG. 5B shows reflectance as a function of wavelength of a reflecting layer of the solar energy system of an embodiment of the invention.

Operation of the light-guide member 101 is illustrated in accordance with FIG. 4 of the invention. Referring to FIG. 4, a light 105 with a specific wave length $\lambda_1$ can pass through the edge filter 104 into the light-guide member 101. The light is then converted from wave length $\lambda_1$ to wave length $\lambda_2$ by the wavelength converting layer 108 so as to fit in with the operation range of the solar cells 116 attached on the edges of the flexible transparent body 102. The light with the specific wave length range $\lambda_2$ has high reflectivity to the edge filter 104 and can be reflected a plurality of times between the edge reflector 104 and a reflecting layer 110. Specifically, the sawtooth microstructure directs light in the light-guide member 101 to be reflected a plurality of times, for a long distance. Referring to FIG. 5A, which shows reflectance as a function of wavelength of the edge filter 104, the edge filter 104 has low reflectance in the wavelength range $\lambda_1$ and high reflectance in the wavelength range $\lambda_2$. Referring to FIG. 5B, the reflecting layer 110 has high reflectance for the entire wavelength range. Therefore, the light in the wavelength range $\lambda_1$ can pass through the edge filter 104, and the light can be converted by the wavelength converting layer to generate a wavelength range $\lambda_2$ which can be reflected a plurality of times between the edge filter 104 and the reflecting layer 110. Referring back to FIG. 4, the light is then reflected by tapers 114 to be received by the solar cells 116. It is noted that the invention specifically designs the slope angle α of the top surface of the light-guide member 101 and the slope angle θ of the slope sides of the sawtooth microstructure on the bottom surface of the light-guide member 101 for the light converted by the wavelength converting layer 108 to generate the specific wave length $\lambda_2$ which can be reflected by the edge filter 104 and the reflecting layer 110 to be received by the solar cells 116.

Figure 6A:
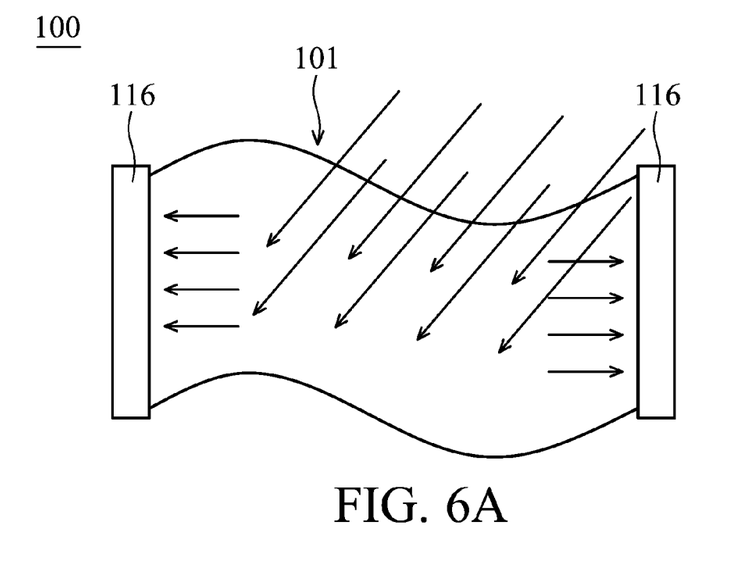
FIG. 6A shows a spread opened solar energy system.
Figure 6B:
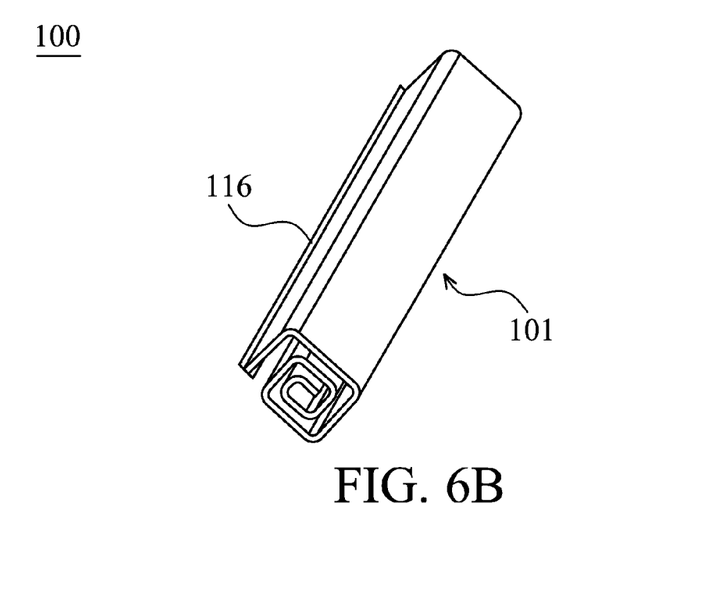
FIG. 6B shows a rolled closed solar energy system.

Referring to FIG. 6A, it can be rolled up when the solar energy system 100 with the light-guide member 101 is in use. On the contrary, the solar energy system 100 is unrolled when it is not in use, as shown in FIG. 6B.

Figure 7:
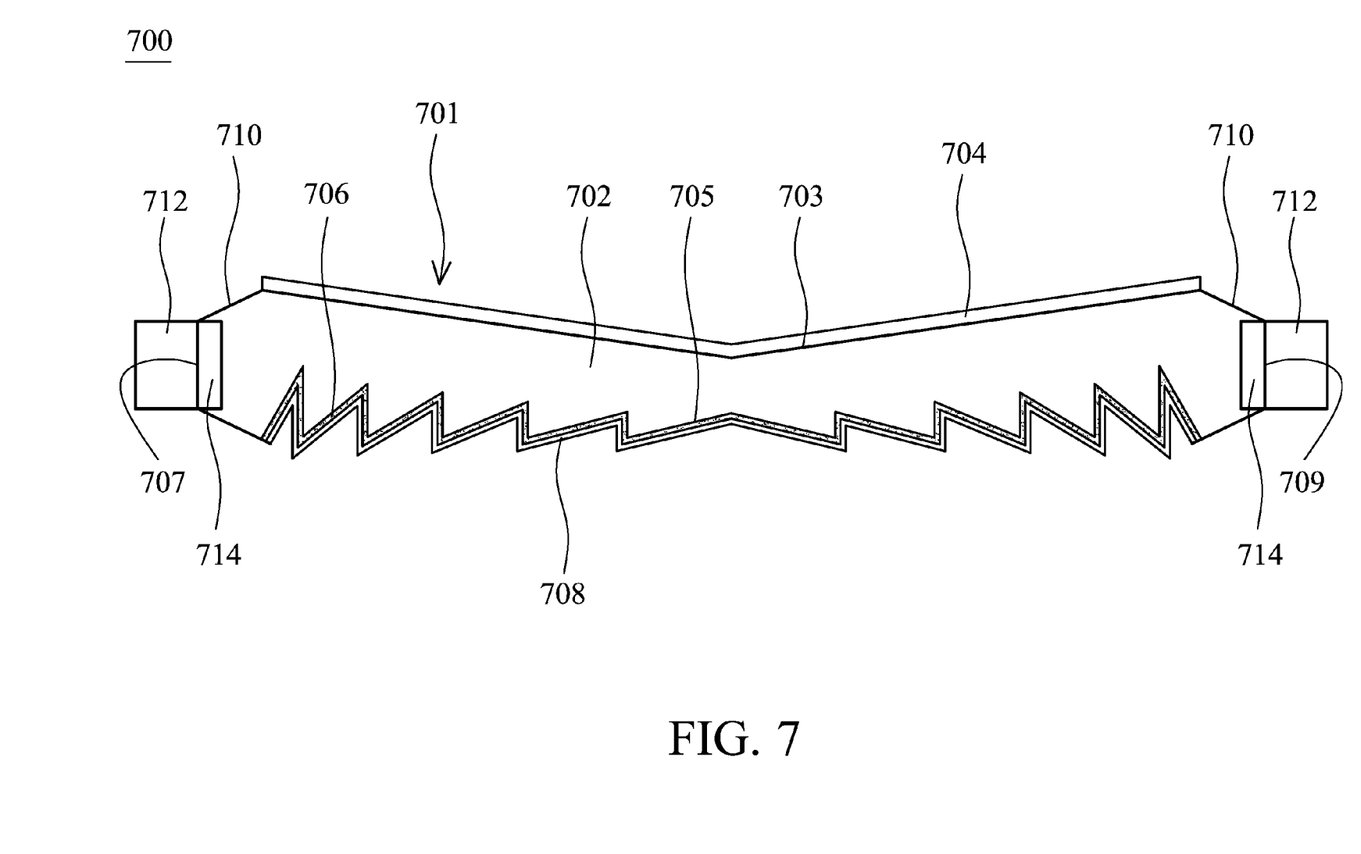
FIG. 7 shows a solar energy system of another embodiment of the invention.

FIG. 7 shows a solar energy system of another embodiment of the invention. Unlike the embodiment as shown in FIG. 1, the solar energy system 700 of the present embodiment arranges the wavelength converting layer 714 at edges of the light-guide member 701 to reduce light scattered by the wavelength converting layer 714. Referring to FIG. 7, a light-guide member 701 primarily comprises a flexible transparent body 702 which includes a top surface 703, a bottom surface 705 and two edge surfaces 707, 709, and can be formed of transparent plastics, such as polymethyl methacrylate (PMMA), polyimide (PI), polyethylene terephthalate (PET), polyethylene naphthalene (PEN) or polydimethylsiloxane (PDMS). The top surface of the light guide member 702 is a light-receiving surface having a wedge-shaped structure, and the bottom surface has a sawtooth microstructure in the embodiment. An edge filter 704 is formed on the top surface 703 of the flexible transparent body 702. A wavelength converting layer 714 is formed on the edges 707, 709 of the flexible transparent body 702. A reflecting layer 706 is formed on the bottom surface 705 of flexible transparent body 702 and a protective layer 708 is formed to cover the reflecting layer 706. In the embodiment, the wavelength converting layer 714 is phosphor or dyes formed by an evaporation, spin coating or immersion process. For example, the wavelength converting layer 714 can be made of organic dyes, such as rhodamine or perylene or inorganic quantum dot material, such as CdTe or ZnTe. The reflecting layer 706 is metal with high reflectivity, such as silver or aluminum, formed by a physical vapor deposition or chemical vapor deposition process. Solar cells 712 are attached respectively to the two edges of the flexible transparent body 702. Tapers 710 are formed on a portion of the top surface and the bottom surface of the flexible transparent body 702 neighboring the solar cells 712 to guide light to the solar cells 712.

Figure 8:
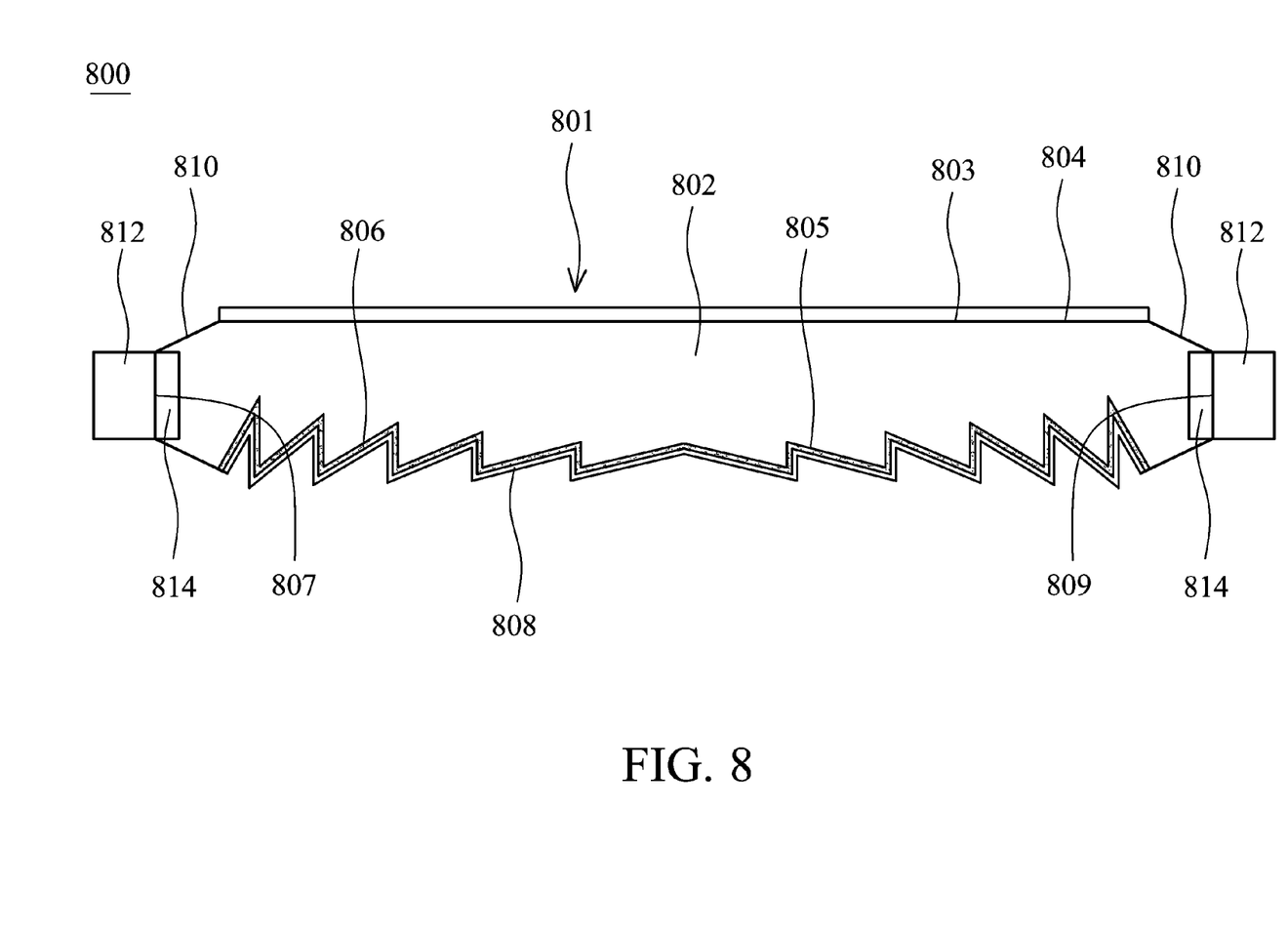
FIG. 8 shows a solar energy system of further another embodiment of the invention.

FIG. 8 shows a solar energy system 800 of yet another embodiment of the invention. Unlike the embodiment as shown in FIG. 7, the top surface 803 of the light-guide member 801 is a plane surface in the embodiment. Referring to FIG. 8, a light-guide member 801 primarily comprises a flexible transparent body 802 which includes a top surface 803, a bottom surface 805 and two edge surfaces 807, 809 and can be formed of transparent plastics, such as polymethyl methacrylate (PMMA), polyimide (PI), polyethylene terephthalate (PET), polyethylene naphthalene (PEN) or polydimethylsiloxane (PDMS). The top surface of the light guide member 801 is a plane surface and the bottom surface has a sawtooth microstructure in the embodiment. An edge filter 804 is formed on the top surface 803 of the flexible transparent body 802 and a wavelength converting layer 814 is formed on the edges 807, 809 of the flexible transparent body. A reflecting layer 806 is formed on the bottom surface 805 of flexible transparent body 802 and a protective layer 808 is formed to cover the reflecting layer 806. Solar cells 812 are attached to the edges of the flexible transparent body 802. Tapers 810 are formed on a portion of the top surface and the bottom surface of the flexible transparent body 802 neighboring the solar cells 812 to guide light to the solar cells 812.

Figure 9:
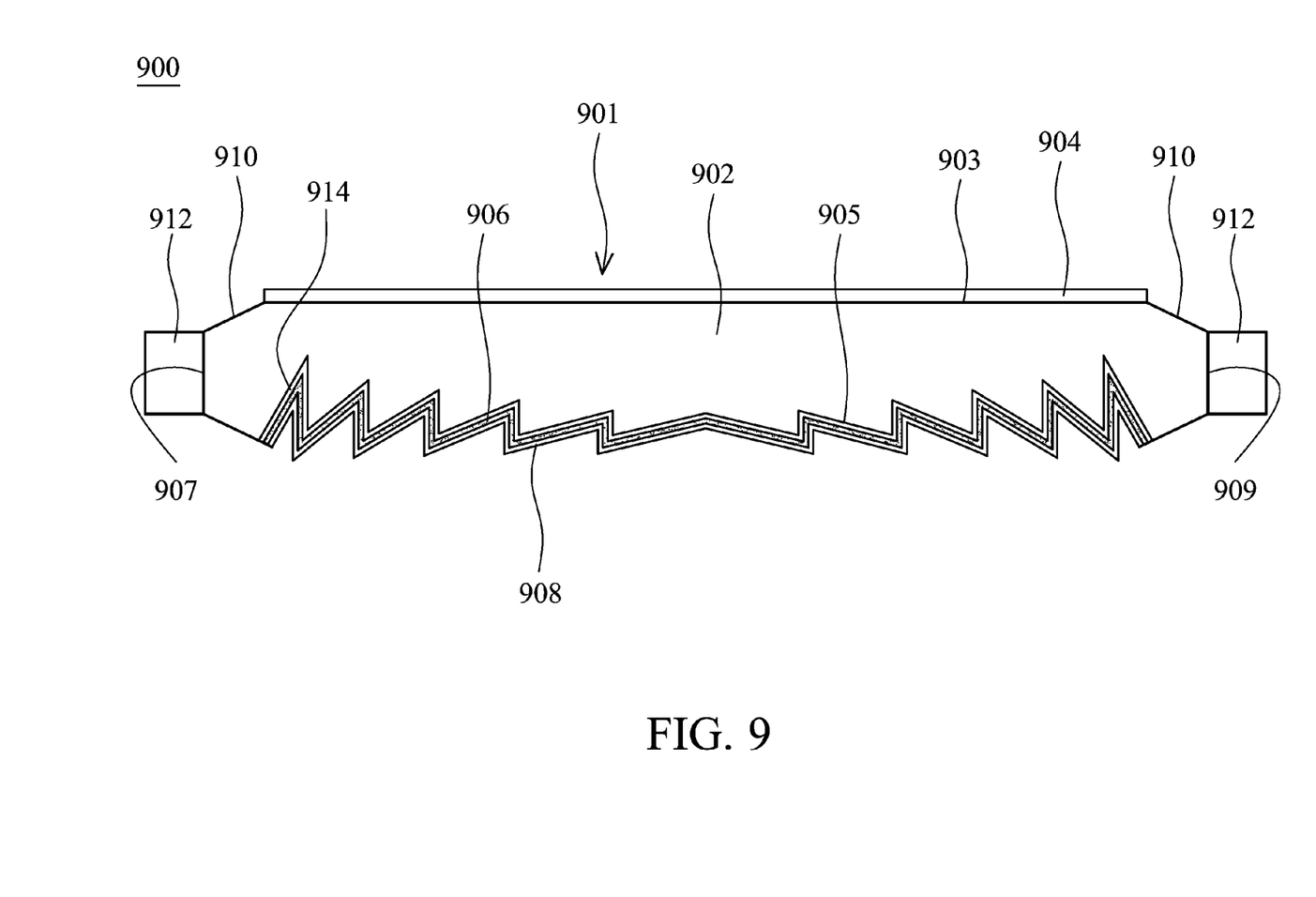
FIG. 9 shows a solar energy system of yet another embodiment of the invention.

FIG. 9 shows a solar energy system 900 of further another embodiment of the invention. Unlike the embodiment shown in FIG. 8, the wavelength converting layer 914 is on the bottom surface of the light-guide member 901 in the embodiment. Referring to FIG. 9, a light-guide member 901 primarily comprises a flexible transparent body 902 which includes a top surface 903, a bottom surface 905 and two edge surfaces 907, 909, and can be formed of transparent plastics. The top surface of the light guide member 901 is a plane surface and the bottom surface has a sawtooth microstructure in the embodiment. An edge filter 904 is formed on the top surface 903 of the flexible transparent body and a wavelength converting layer 914 is formed on the bottom surface 905 of the flexible transparent body 902. A reflecting layer 906 is formed under the wavelength converting layer 914 and a protective layer 908 is formed to cover the reflecting layer 906. In the embodiment, the wavelength converting layer can be made of phosphor or dyes to be formed on the bottom surface of the flexible transparent body 902 by an evaporation, a spin coating or an immersion process. Solar cells 912 are attached to the edges of the flexible transparent body 902. Tapers 910 are formed on a portion of the top surface and the bottom surface of the flexible transparent body 902 neighboring the solar cells 912 to guide light to the solar cells 912.

Figure 10:
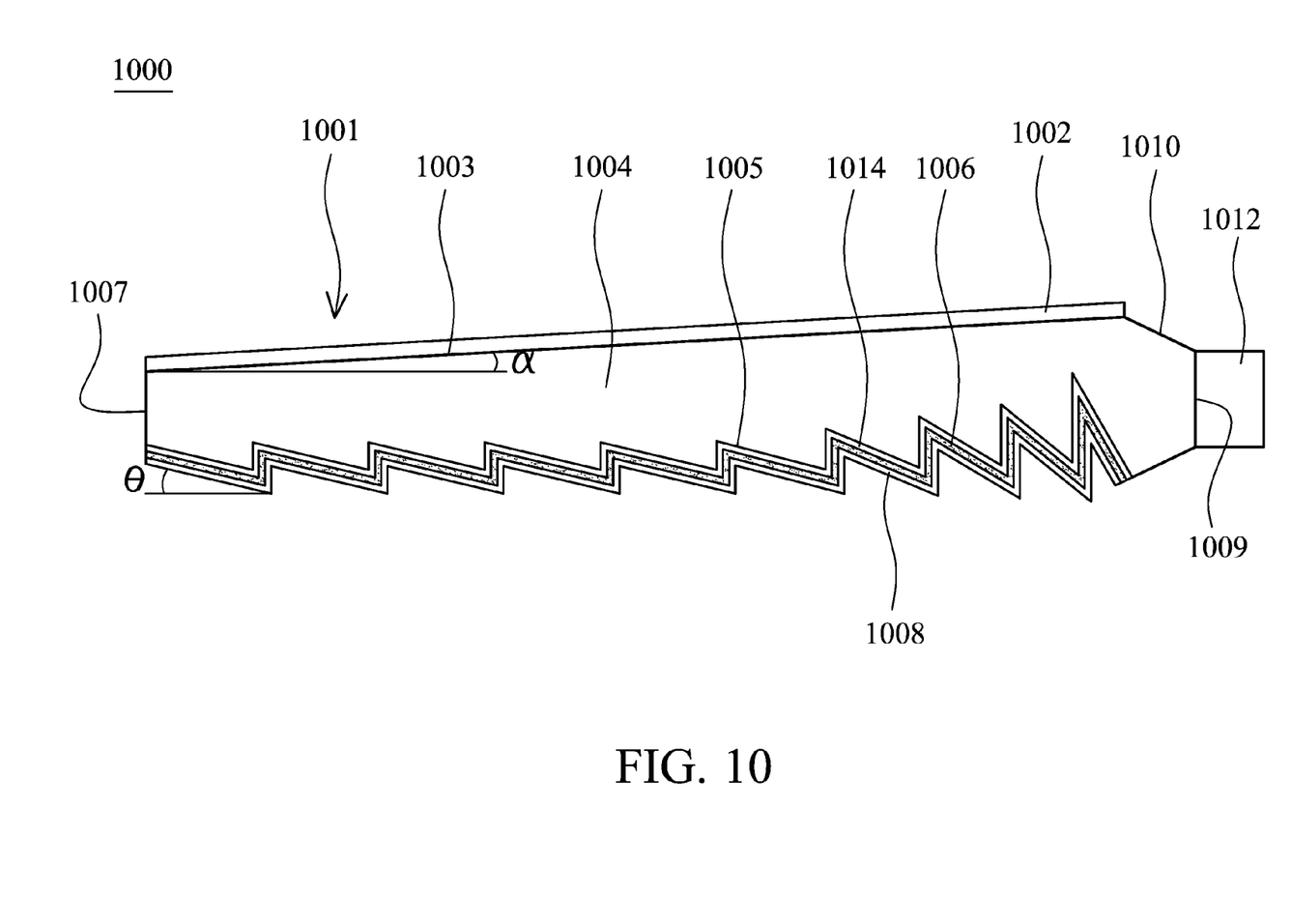
FIG. 10 shows a solar energy system of yet further another embodiment of the invention.

FIG. 10 shows a solar energy system of yet a further embodiment of the invention. Unlike the embodiment shown in FIG. 2 and FIGS. 7-9, the solar energy system 1000 is not symmetrical and only has solar cells at one edge. Referring to FIG. 10, a light-guide member 1001 primarily comprises a flexible transparent body 1004 which includes a top surface 1003, a bottom surface 1005 and two edge surfaces 1007, 1009, and the flexible transparent body 1004 is formed of transparent plastics. The top surface 1003 of the light-guide member 1001 slopes upwardly at a slope angle α from one edge 1007 of the flexible transparent body 1004 to another edge 1009. In an embodiment of the invention, the slope angle α is 0°~15°. The bottom surface 1005 of the light-guide member 1001 has a sawtooth microstructure and has a plurality slope sides and vertical sides An edge filter 1002 is formed on the top surface 1003 of the flexible transparent body and a wavelength converting layer 1014 is formed on the bottom surface 1005 of the flexible transparent body 1004. A reflecting layer 1006 is formed under the wavelength converting layer 1014 and a protective layer 1008 is formed to cover the reflecting layer 1006. Solar cells 1012 are attached to the edge of the flexible transparent body. A taper 1010 is formed on a portion of the top surface and the bottom surface of the flexible transparent body 1004 neighboring the solar cells 1012 to guide light to the solar cells 1012.

Accordingly, the invention is inventive and have advantageous characteristic as follows. An ultra thin flexible solar energy system can be achieved by film to film bonding technology. Since the solar energy system is flexible, applications thereof may be increased, such as in the clothing, window curtain or portable devices. The invention uses a microstructure for light to pass through a phosphor layer to transfer wide wavelength ranged sunlight to the wavelength range for solar cells to increase the light photoelectric conversion efficiency. The invention designs a light input area and a solar cell area ratio of the solar energy system to have suitable electrical power with solar cells having smaller area.

While the invention has been described by way of example and in terms of the preferred embodiments, it is to be understood that the invention is not limited to the disclosed embodiments. It is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A solar energy system, comprising:
   a flexible transparent body, including a top surface, a bottom surface and two edges, wherein the top surface is a light receiving surface for receiving a light with a first wave-length;
   a plurality of solar cells, disposed on at least one of the two edges of the flexible transparent body, wherein the light having a second wave-length can be converted into electrical energy by the plurality of solar cells; and
   a wavelength converting layer, for converting light with the first wave-length to light with the second wave-length, wherein the bottom surface of the flexible transparent body has a sawtooth microstructure which is a mirror symmetrical structure having a plurality of series connected slope sides and vertical sides, and the first slope sides have a slope angles $\theta_1$, a horizontal length $L_1$ and a vertical height $H_1$, the second slope sides have a slope angles $\theta_2$, a horizontal length $L_2$ and a vertical height $H_2$, and the nth slope sides have a slope angles $\theta_n$, a horizontal length $L_n$ and a vertical height $H_n$ from a center point to edges of the flexible transparent body,
   wherein the series connected slope sides and vertical sides of the sawtooth microstructure are gradually changed so that $\theta_1 < \theta_2 < \ldots < \theta_n$, $L_1 > L_2 > \ldots > L_n$, and $H_1 < H_2 < \ldots < H_n$.

2. The solar energy system as claimed in claim 1, wherein the wavelength converting layer only covers the bottom surface of the flexible transparent body comprising the sawtooth microstructure.

3. The solar energy system as claimed in claim 1, wherein the wavelength converting layer is disposed on at least one of the two edges of the flexible transparent body.

4. The solar energy system as claimed in claim 1, further comprising a edge filter disposed on the top surface of the flexible transparent body, wherein the edge filter has low reflectivity in the first wave-length and has high reflectivity in the second wave-length.

5. The solar energy system as claimed in claim 4, wherein the edge filter is a stack of at least two dielectric layers with high and low refraction indexes.

6. The solar energy system as claimed in claim 5, wherein the two dielectric layers includes a first dielectric layer and a second dielectric layer, the first dielectric layer is $TiO_2$ and the second dielectric layer is $SiO_2$, the first dielectric layer is $Nb_2O_5$ and the second dielectric layer is SiO2, or the first dielectric layer is $Ta_2O_5$ and the second dielectric layer is and $SiO_2$.

7. The solar energy system as claimed in claim 1, wherein the top surface of the flexible transparent body is wedge-shaped and slopes upwardly at a slope angle α from a center point to the two edges of the flexible transparent body.

8. The solar energy system as claimed in claim 1, further comprising a reflecting layer disposed on the bottom surface of the flexible transparent body.

9. The solar energy system as claimed in claim 8, wherein the reflecting layer comprises metal with high reflectivity.

10. The solar energy system as claimed in claim 4, further comprising a taper on a portion of the top surface and the bottom surface of the flexible transparent body neighboring the solar cells.

11. The solar energy system as claimed in claim 10, wherein the light with second wave-length can be reflected a plurality of times between the edge filter and the reflecting layer and is guided to the solar cells in accordance with the taper.

12. The solar energy system as claimed in claim 1, wherein the top surface of the flexible transparent body is a plane surface.

13. The solar energy system as claimed in claim 1, wherein the flexible transparent body is formed of transparent plastic.

14. The solar energy system as claimed in claim 13, wherein the transparent plastic is polymethyl methacrylate (PMMA), polyimide (PI), polyethylene terephthalate (PET), polyethylene naphthalene (PEN) or polydimethylsiloxane (PDMS).

15. The solar energy system as claimed in claim 1, wherein the wavelength converting layer comprises organic phosphor or inorganic phosphor.

16. The solar energy system as claimed in claim 15, wherein the organic phosphor is rhodamine or perylene and the inorganic phosphor is quantum dot material including CdTe or ZnTe.

17. The solar energy system as claimed in claim 1, wherein the sawtooth microstructure extends from one edge to an another edge of the bottom surface of the flexible transparent body.

18. The solar energy system as claimed in claim 1, wherein the top surface of the flexible transparent body slopes upwardly from an edge to an another edge of the flexible transparent body.

* * * * *